United States Patent
Maeda et al.

(10) Patent No.: US 10,602,649 B2
(45) Date of Patent: Mar. 24, 2020

(54) WORK HEAD UNIT, MOUNTING DEVICE, AND WORK HEAD UNIT CONTROL METHOD

(71) Applicant: FUJI CORPORATION, Chiryu (JP)

(72) Inventors: Fumitaka Maeda, Chiryu (JP); Hidetoshi Ito, Okazaki (JP)

(73) Assignee: FUJI CORPORATION, Chiryu (JP)

( * ) Notice: Subject to any disclaimer, the term of this patent is extended or adjusted under 35 U.S.C. 154(b) by 215 days.

(21) Appl. No.: 15/506,927

(22) PCT Filed: Aug. 29, 2014

(86) PCT No.: PCT/JP2014/072750
§ 371 (c)(1),
(2) Date: Feb. 27, 2017

(87) PCT Pub. No.: WO2016/031053
PCT Pub. Date: Mar. 3, 2016

(65) Prior Publication Data
US 2017/0280597 A1 Sep. 28, 2017

(51) Int. Cl.
*B23P 19/00* (2006.01)
*H05K 3/30* (2006.01)
(Continued)

(52) U.S. Cl.
CPC .......... *H05K 13/046* (2013.01); *G05B 19/402* (2013.01); *H05K 13/041* (2018.08);
(Continued)

(58) Field of Classification Search
CPC .... H05K 13/046; H05K 13/041; H05K 13/08; H05K 13/0413; G05B 19/402;
(Continued)

(56) References Cited

U.S. PATENT DOCUMENTS 4,624,050 A * 11/1986 Hawkswell ........ H05K 13/0413
29/26 A
4,794,689 A * 1/1989 Seno .................... H05K 13/082
29/740
(Continued)

FOREIGN PATENT DOCUMENTS

JP  4-188898 A  7/1992
JP  5-206691 A  8/1993
(Continued)

OTHER PUBLICATIONS

Extended Search Report dated Aug. 2, 2017 in European Patent Application No. 14900735.3.
(Continued)

*Primary Examiner* — Thiem D Phan
(74) *Attorney, Agent, or Firm* — Oblon, McClelland, Maier & Neustadt, L.L.P.

(57) ABSTRACT

A work head unit that detects the rotational position of suction nozzle with first Q-axis encoder positioned facing component holding section that holds a component. With the work head unit, it is desirable to detect the orientation of component holding section at two locations: suction nozzle and syringe member.

11 Claims, 5 Drawing Sheets

(51) Int. Cl.
*H05K 13/04* (2006.01)
*G05B 19/402* (2006.01)

(52) U.S. Cl.
CPC ............... *H05K 13/0413* (2013.01); *G05B 2219/37175* (2013.01); *G05B 2219/37263* (2013.01); *Y10T 29/49133* (2015.01); *Y10T 29/53174* (2015.01)

(58) Field of Classification Search
CPC ..... G05B 2219/37263; Y10T 29/49826; Y10T 29/53357; Y10T 29/49133; Y10T 29/53174; A61M 2205/14; A61M 2205/215
USPC ................. 29/739, 834, 740, 744, 760, 832
See application file for complete search history.

(56) References Cited

U.S. PATENT DOCUMENTS

| | | | | |
|---|---|---|---|---|
| 2002/0031279 | A1* | 3/2002 | Shimizu | H05K 13/0452 382/291 |
| 2002/0088107 | A1* | 7/2002 | Van De Rijdt | H05K 13/0409 29/592.1 |
| 2003/0053300 | A1* | 3/2003 | Suhara | H05K 13/0417 361/760 |
| 2007/0124922 | A1* | 6/2007 | Kawasumi | H05K 13/0452 29/739 |

FOREIGN PATENT DOCUMENTS

| | | |
|---|---|---|
| JP | 3064404 B2 | 5/2000 |
| JP | 2001-300881 A | 10/2001 |
| JP | 2005-286171 A | 10/2005 |
| JP | 2013-143396 A | 7/2013 |

OTHER PUBLICATIONS

Japanese Office Action dated Aug. 21, 2018 in Japanese Patent Application No. 2016-545196 (submitting unedited computer generated English translation only), 4 pages.

International Search Report dated Dec. 2, 2014, in PCT/JP14/72750 filed Aug. 29, 2014.

* cited by examiner

WORK HEAD UNIT, MOUNTING DEVICE, AND WORK HEAD UNIT CONTROL METHOD

TECHNICAL FIELD

The present invention relates to a work head unit, a mounting device, and a work head unit control method.

BACKGROUND ART

Conventionally, as a mounting head that performs mounting of components onto a board, known is a head provided with a rotation plate formed on which are multiple slits with a slit angle θ that varies by each slit, nozzles of the mounting head arranged to correspond to the positions of the slits, and a control section registered with the angle θ between the above slits (for example, refer to patent literature 1). With this mounting head, it is possible to detect at high speed the origin position of the mounting head in the rotation direction. Also, there are is a known mounting head in which a rotation member is positioned at a response position of a sensor at the zero count position of the encoder used by the motor that rotationally drives the rotary head, and a reference spindle is directly below a pushing down member, the configuration being such that the angle of each spindle is zero at the zero count position of the encoder used by the motor that axially rotates each spindle. With this mounting head, it is possible to adjust the origin position without performing data backup.

CITATION LIST

Patent Literature

Patent Literature 1: JP-A-H5-206691
Patent Literature 2: JP-A-2013-143396

SUMMARY OF INVENTION

Technical Problem

However, with the mounting heads of patent literature 1 and 2, although it is possible to detect the rotational position of the mounting head, not enough consideration is given to information directly related to the orientation of a held component. There are cases in which mounting cannot be performed appropriately if during mounting, for example, the orientation of a component held on the mounting head is rotated with respect to the center of the rotation axis of the nozzle. Thus, for work heads, it is desirable to acquire with good accuracy information related to the orientation of a held component, such as a rotational position of the component.

The present invention takes account of such problems and an object thereof is to provide a work head unit, a mounting device, and a work head unit control method that allow for information related to the orientation of a held component to be acquired with better accuracy.

Solution to Problem

The present invention using the following means to achieve the above object.

The present invention of a work head unit is provided with a component holding section configured to hold a component and be rotatable around a rotational axis, and a detection section provided at a position facing the component holding section and configured to detect the orientation of the component holding section.

With this work head unit, the detection section detects the orientation of the component holding section at a position facing the component holding section that holds a component. Because the orientation of the portion holding the component is detected, compared to, for example, an item that detects the orientation of something other than the component holding section, information better reflecting the orientation of the component is acquired. Thus, information related to the orientation of a held component is acquired with more accuracy. Here, "orientation of component holding section" may be a rotational position with respect to a specified axis of the component holding section.

The present invention of a work head unit control method is a control method for a work head provided with a component holding section configured to hold a component and be rotatable around a rotational axis, and a detection section provided at a position facing the component holding section and configured to detect the orientation of the component holding section, the work head unit control method comprising: (a) a step of correcting an orientation of the component holding section based on information of the orientation of the component holding section detected by the detection section.

With this control method, because the orientation of the component holding section holding the component is detected, compared to, for example, an item that detects the orientation of something other than the component holding section, information better reflecting the orientation of the component is acquired. Thus, information related to the orientation of a held component is acquired with more accuracy. Also, because correction of the orientation of the component holding section is performed using detection results of the orientation of the portion holding the component, the orientation of the component is corrected more accurately. Note that, for this control method, various types of work head unit may be used, and various configurations may be added to realize various functions of the above work head unit.

DESCRIPTION OF EMBODIMENTS

Figure 1:
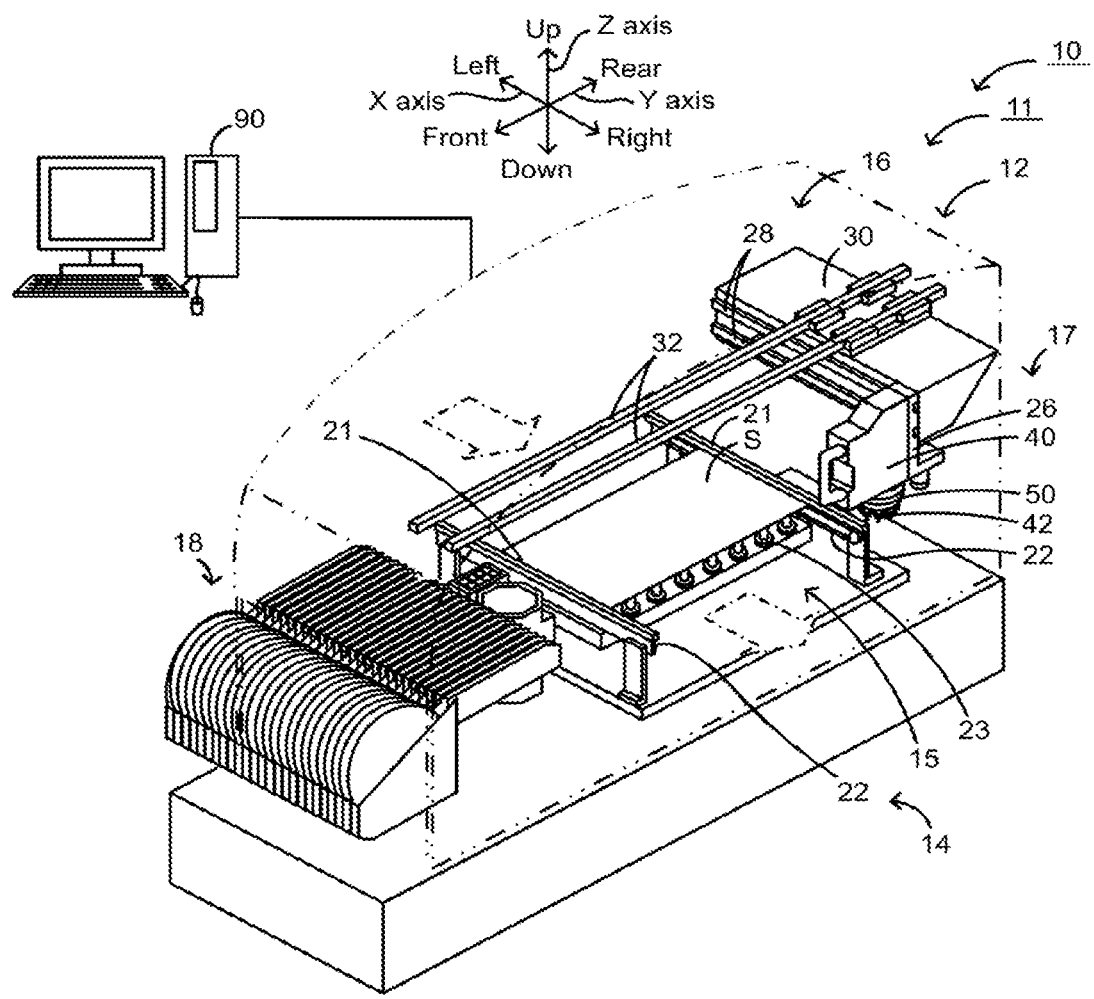
FIG. 1 is a schematic view of mounting system 10.
Figure 2:
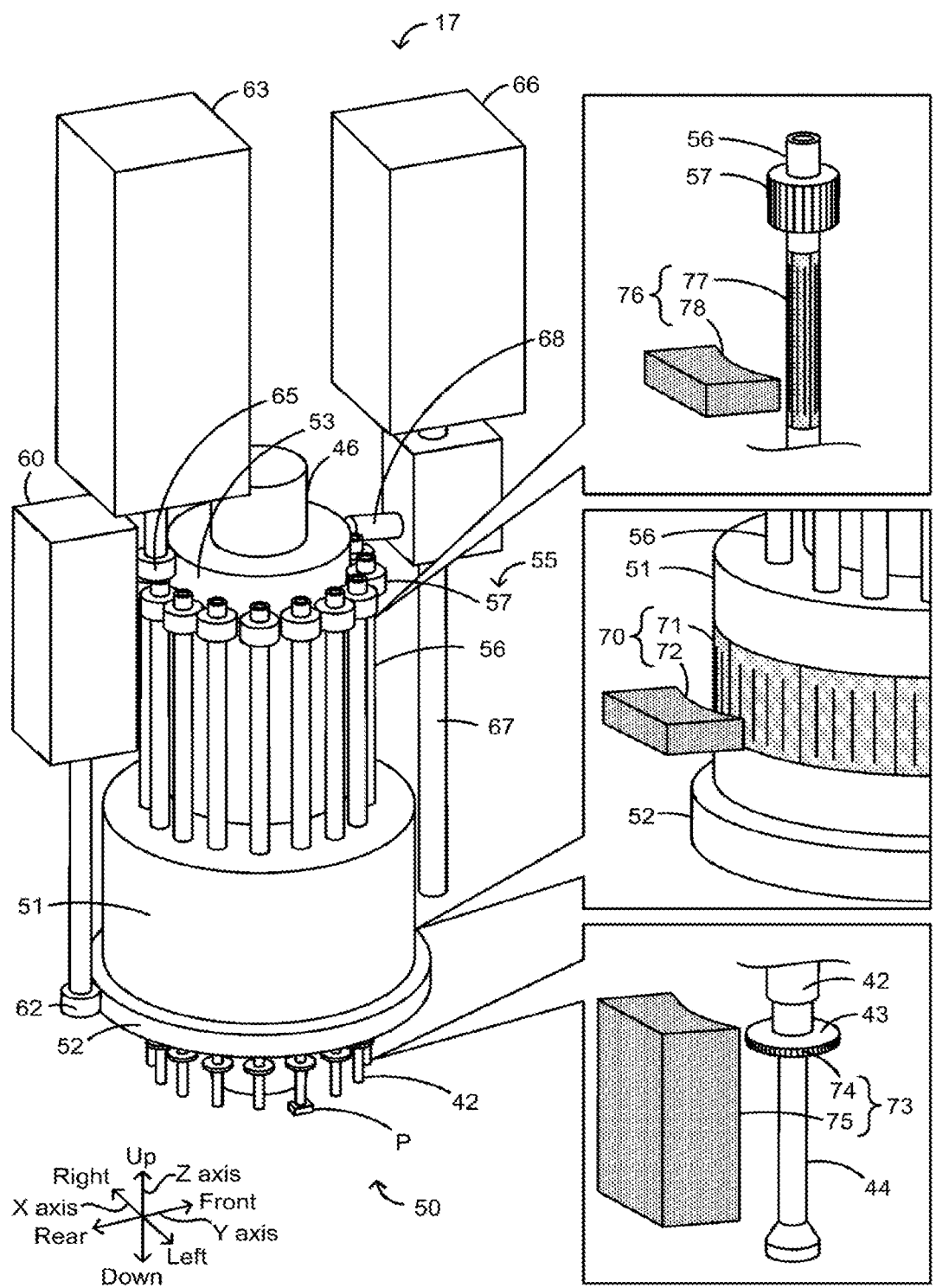
FIG. 2 illustrates an overview of mounting head unit 17.
Figure 3A:
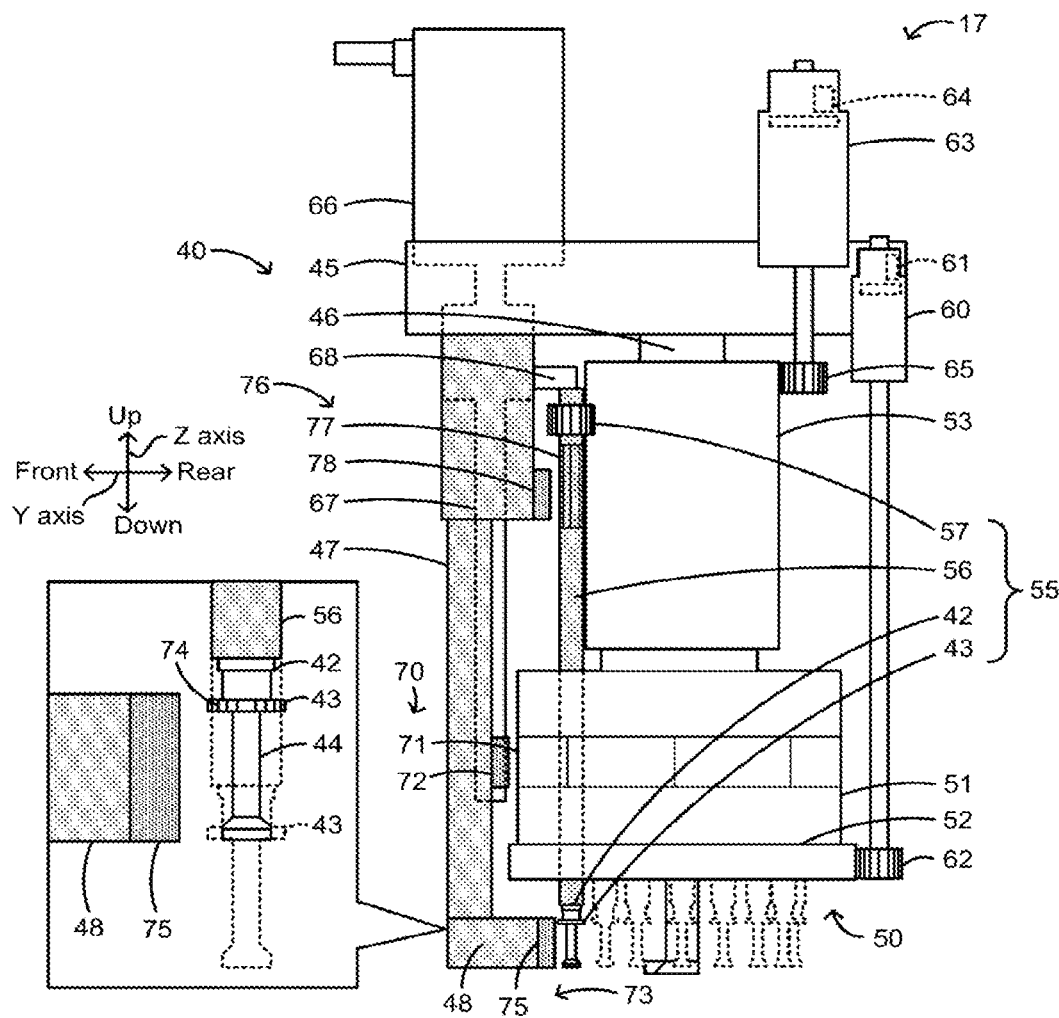
FIG. 3 illustrates mounting head 50 of mounting head unit 17.
Figure 3B:
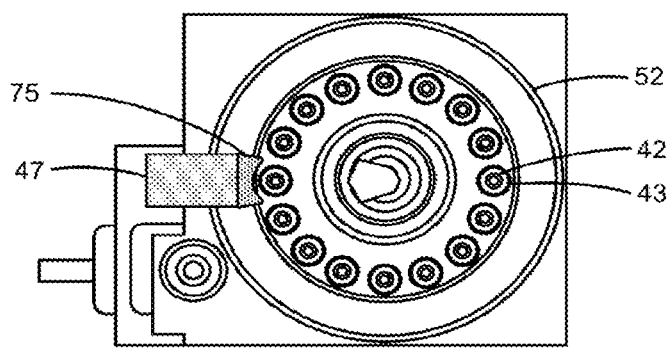
Figure 4:
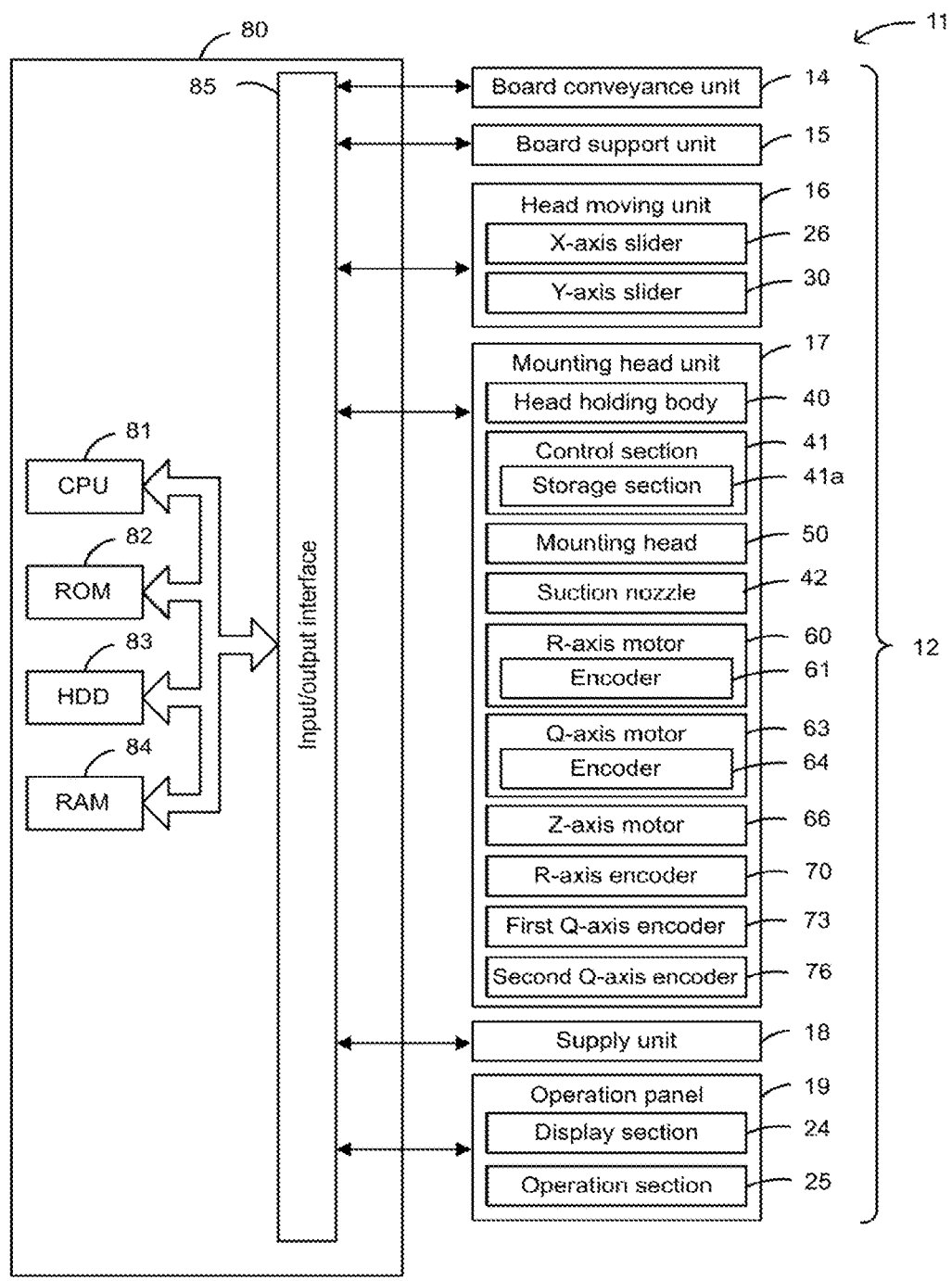
FIG. 4 is a block diagram showing electrical connections of mounting device 11.

Hereinafter, an embodiment of the present invention will be described with reference to the figures. FIG. 1 is a schematic view of mounting system 10. FIG. 2 illustrates an overview of mounting head unit 17. FIG. 3 illustrates mounting head unit 17 provided with mounting head 50, with FIG. 3(a) showing a side surface of mounting head 50 and FIG. 3(b) showing the bottom surface of mounting head 50. FIG. 4 is a block diagram showing electrical connections of mounting device 11. The present embodiment of mounting system 10 is provided with mounting device 11 that includes mounting processing unit 12 and performs mounting processing of mounting component P (refer to FIG. 2)

onto board S, and management computer 90 that performs management of information related to mounting processing (for example, production job data). In the present embodiment, left-right directions (X axis), front-rear directions (Y axis), and up-down directions (Z axis) are set as shown in FIGS. 1 to 3. Note that, mounting processing includes processing such as arranging component P above board S, mounting, insertion, joining, and gluing.

Mounting device 11 is provided with board conveyance unit 14 configured to convey board S, board support unit 15 configured to support board S from below, mounting head unit 17 configured to pick up (collect) component P and mount component P on board S, and head moving unit 16 configured to move mounting head unit 17 in the X-Y direction (refer to FIG. 1). Also, mounting device 11 is provided with supply unit 19 attached to which is a reel housing components P, operation panel 19 including display section 24 that displays a display screen and operation section 25 used by an operator to input various instructions (refer to FIG. 4), and control device 80 configured to perform various control actions (refer to FIG. 4).

Board conveyance unit 14 conveys board S from left to right using conveyor belts 22 and 22 each attached to the front and rear pair of support plates 21 and 21. Board support unit 15 is provided with multiple support pins 23 that support board S from below and supports board S conveyed and fixed by board conveyance unit 14 from the underside.

Head moving unit 16 is provided with X-axis slider 26, Y-axis slider 30, and so on. X-axis slider 26 is attached to the front surface of Y-axis slider 30, which is slidable in the front-rear direction, so as to be slidable in the left-right direction. Y-axis slider 30 is slidably attached to a pair of guide rails 32 and 32 that extend in the front-rear direction. Note that, guide rails 32 and 32 are fixed to an internal section of mounting device 11. A pair of upper and lower guide rails 28 and 28 that extend in the left-right direction are provided on the front surface of Y-axis slider 30, and X-axis slider 26 is attached to these guide rails 28 and 28 so as to be slidable in the left-right direction. Mounting head unit 17 moves in the left and right directions based on the moving in the left and right directions of X-axis slider 26, and moves in the front and rear directions based on the moving in the front and rear directions of Y-axis slider 30. Note that, each slider 26 and 30 is driven by a drive motor, which are not shown.

Mounting head unit 17 is attached to the front surface of X-axis slider 26. Mounting head unit 17 is provided with head holding body 40 configured to hold mounting head 50 arranged on X-axis slider 26, suction nozzle 42 that picks up component P, and mounting head 50 to which at least one suction nozzle 42 can be attached and detached. As shown in FIG. 3, head holding body 40 is provided with holding body main body 45 attached to X-axis slider 26, and engaging shaft 46 arranged below holding body main body 45. Engaging shaft 46 is arranged with respect to holding body main body 45 to be rotatable about its own axis, and engages with mounting head 50 by being inserted into a bottomed hole formed in the center of mounting head 50 (Q-axis gear 53). Z-axis motor 66, Q-axis motor 63, and R-axis motor 60 that rotates mounting head 50 are arranged on holding body main body 45. Encoder 61 is arranged on R-axis motor 60 (refer to FIG. 3) and basic control of the rotational position is performed based on encoder 61. Encoder 61 may be a transparent type optical encoder. Q-axis motor 63 is provided with encoder 64 in a similar manner to R-axis motor 60. Z-axis motor 66 raises and lowers suction nozzle 42 by the movement of horizontal section 68 along Z-axis guide 67 that extends vertically downwards. Note that, the rotational axis of mounting head 50 (rotary section 51) is labeled as the R axis, and the rotational axis of suction nozzles 42 (component holding section 55) is labeled as the Q axis.

Head holding body 40 holds mounting head 50. Mounting head 50 is provided with, for example, sixteen component holding sections 55, such that sixteen suction nozzles 42 can be attached (refer to FIGS. 2 and 3). Mounting head 50 is configured as a rotary type work head that holds head holding body 40 in a rotatable state. Mounting head 50 is provided with rotary section 51 formed from a cylindrical member, R-axis gear 52 arranged under rotary section 51, Q-axis gear 53 arranged above rotary section 51, and multiple syringe members 56 formed from long cylinders with suction nozzle 42 attached to the bottom end. Mounting head 50 is provided with component holding sections 55 that are able to be raised and lowered, and that include suction nozzle 42 that collects component P and syringe 56 to and from which suction nozzle 42 can be attached and detached. Mounting head 50 is held on head holding body 40 so as to be rotatable around its own rotation axis (R axis) and is provided with rotary section 51 that includes a central axis similar to the rotation axis. Rotary section 51, for example, supports sixteen syringe members 56 to be movable up and down and rotatable around a center axis of the syringe member 56. R-axis gear 52 is a cylindrical disk member with an outer diameter larger than rotary section 51, and has gear teeth formed on its outside circumferential surface. R-axis gear 52 engages with small gears 62 connected to the rotational axis of R-axis motor 60, and is rotated by R-axis motor 60 via the small gears 62. Q-axis gear 53 is a cylindrical tube member with an outer diameter smaller than rotary section 51, and has gear teeth formed on its outside circumferential surface. Syringe member 56 has small gear 57 arranged on the upper end and has suction nozzle 42 attached to the lower end. Small gear 57 engages with the gear teeth formed on the outer circumference of Q-axis gear 53. Syringe members 56 are arranged evenly spaced around the outer circumference of Q-axis gear 53.

Suction nozzle 42 uses pressure to pick up and release component P at the nozzle tip. Suction nozzle 42 includes disk-shaped flange 43, and pipe section 44 formed at the tip (refer to FIGS. 2 and 3). Component holding section 55 is configured from suction nozzle 42 and syringe member 56. Component holding section 55 is used for holding component P to be rotatable around a rotational axis (Q axis). Component holding section 55 (suction nozzle 42) is rotated around the rotational axis by the driving power of Q-axis motor 63 that is transmitted via small gear 65 connected to Q-axis motor 63, Q-axis motor 53, and small gear 57 arranged on the top side of syringe member 56, thereby allowing the angle of held component P to be adjusted. Component holding section 55 is raised and lowered in the Z-axis direction (vertical direction) along Z-axis guide 67 by the driving force of Z-axis motor 66 that is transmitted via horizontal section 68. With mounting head 50, component holding sections 55 are raised and lowered in the Z-axis direction at a single specified raising and lowering position (refer to FIG. 3) positioned at the front side in the Y-axis direction of mounting head unit 17. Note that, a collecting member for collecting component P is above described as suction nozzle 42, but the collecting member is not limited to this so long as it is capable of collecting component P, for example, a mechanical chuck that collects component p by grabbing, or the like, may be used.

Pillar-shaped support member 47 is provided pointing downwards at the front side of holding body main body 45 to support, as a detection section, R-axis encoder 70, first Q-axis encoder 73, second Q-axis encoder 76, and the like. Support member 47 extends to a position facing suction nozzle 42. Horizontal section 48 facing the suction nozzle 42 side is formed at the lower end of support member 47, and first Q-axis encoder 73 is provided at the tip of horizontal section 48. R-axis encoder 70 is a detection section that directly detects the rotational position of mounting head 50 (rotary section 51), and is configured from a reflective-type optical encoder. R-axis encoder 70 is arranged at a position facing rotary section 51, which is a cylindrical section of mounting head 50. R-axis encoder 70 is provided with code section 71 that is formed spanning a central section of the outer circumference of rotary section 51, and element section 72 arranged on support member 47 at a position facing code section 71. Code section 71 includes a region that reflects, and a region that does not reflect, light emitted from element section 72. Element section 72 is provided with an emitter that emits light and a receiver that receives light reflected by code section 71. R-axis encoder 70 emits light from element section 72 towards code section 71, and determines the rotational position of rotary section 51 by detecting the pattern of light reflected from code section 71.

First Q-axis encoder 73 is a detection section that directly detects the rotational position of suction nozzle 42 attached to the lower end of component holding section 55, and is configured from a reflective-type optical encoder. First Q-axis encoder 73 is arranged at a position facing flange 43 of suction nozzle 42. First Q-axis encoder 73 is provided with code section 74 that is formed spanning the outer circumference of flange 43, and element section 75 arranged on support member 47 at a position facing code section 74. With first Q-axis encoder 73, element section 75 formed lengthwise in the moving direction of suction nozzle 42 is fixed on support member 47 so as to face flange 43 in either the initial position of suction nozzle 42 (shown by the solid lines in the magnified box of FIG. 3) or the extended position of suction nozzle 42 (shown by the dotted lines in the magnified box in FIG. 3) when component holding section 55 is raised and lowered. Second Q-axis encoder 76 is a detection section that directly detects the rotational position of syringe member 56 adjacent to small gear 57 at the top end of component holding section 55, and is configured from a reflective-type optical encoder. Second Q-axis encoder 76 is arranged on a cylindrical tube section on the top end side of syringe member 56. Second Q-axis encoder 76 is provided with code section 77 that is formed spanning the outer circumference of syringe member 56, and element section 78 arranged on support member 47 at a position facing code section 77. Note that, code section 74, code section 77, element section 75, and element section 78 respectively have the same configuration as code section 71 and element section 72, thus descriptions are omitted. Element section 72 of R-axis encoder 70, element section 75 of first Q-axis encoder 73, and element section 78 of second Q-axis encoder 76 are arranged facing rotary section 51 and component support section 55 from the outer circumference side of mounting head unit 17 (mounting head 50).

Mounting head unit 17 includes memory section 41a on which information is memorized, and control section 41 configured to control mounting head unit 17 overall (refer to FIG. 4). Control section 41 is provided with a CPU, ROM, RAM, and so on. Information of mounting head 50, information of suction nozzle 42, and so on is memorized on memory section 41a. Control section 41 is electrically connected to the detection sections of R-axis encoder 70, first Q-axis encoder 73, second Q-axis encoder 76, and the like, and acquires signals from these detections sections.

As shown in FIG. 4, control device 80 is configured from a microprocessor based around CPU 81, ROM 82 that memorizes a processing program, HDD 83 that memorizes various data, RAM 84 used as working memory, input/output interface 85 for performing communication of electric signals with external devices, and so on, and these are connected by a bus. Control device 80 is connected such that two-way communication is possible to board conveyance unit 14, board support unit 15, head moving unit 16, mounting head unit 17, supply unit 18, operation panel 19, and the like, and exchanges signals with these units.

Next, operation of mounting system 10 of the present embodiment as configured above is described, with the mounting processing of mounting device 11 being described first. The mounting processing routine is memorized on HDD 83 of control device 80, and is run based on a production start command from an operator. When the routine is run, CPU 81 controls board conveyance unit 14 and board support unit 15 such that board S is conveyed into the device and fixed at the mounting position. Then, CPU 81 reads production job data, sets components P to be arranged on board 2, and performs processing to attach mounting head 50 and suction nozzle 42 used to perform collection of component P to head holding body 40. Next, CPU 81 controls head moving unit 16 and mounting head unit 17 to collect component P using suction nozzle 42 and performs processing to arrange component P on board S. Then, when mounting processing of the present board S is complete, that board S is unloaded, the next board S is loaded and fixed at the mounting position. CPU 81 repeatedly performs the above processing until production of the entire board S is complete.

Figure 5:
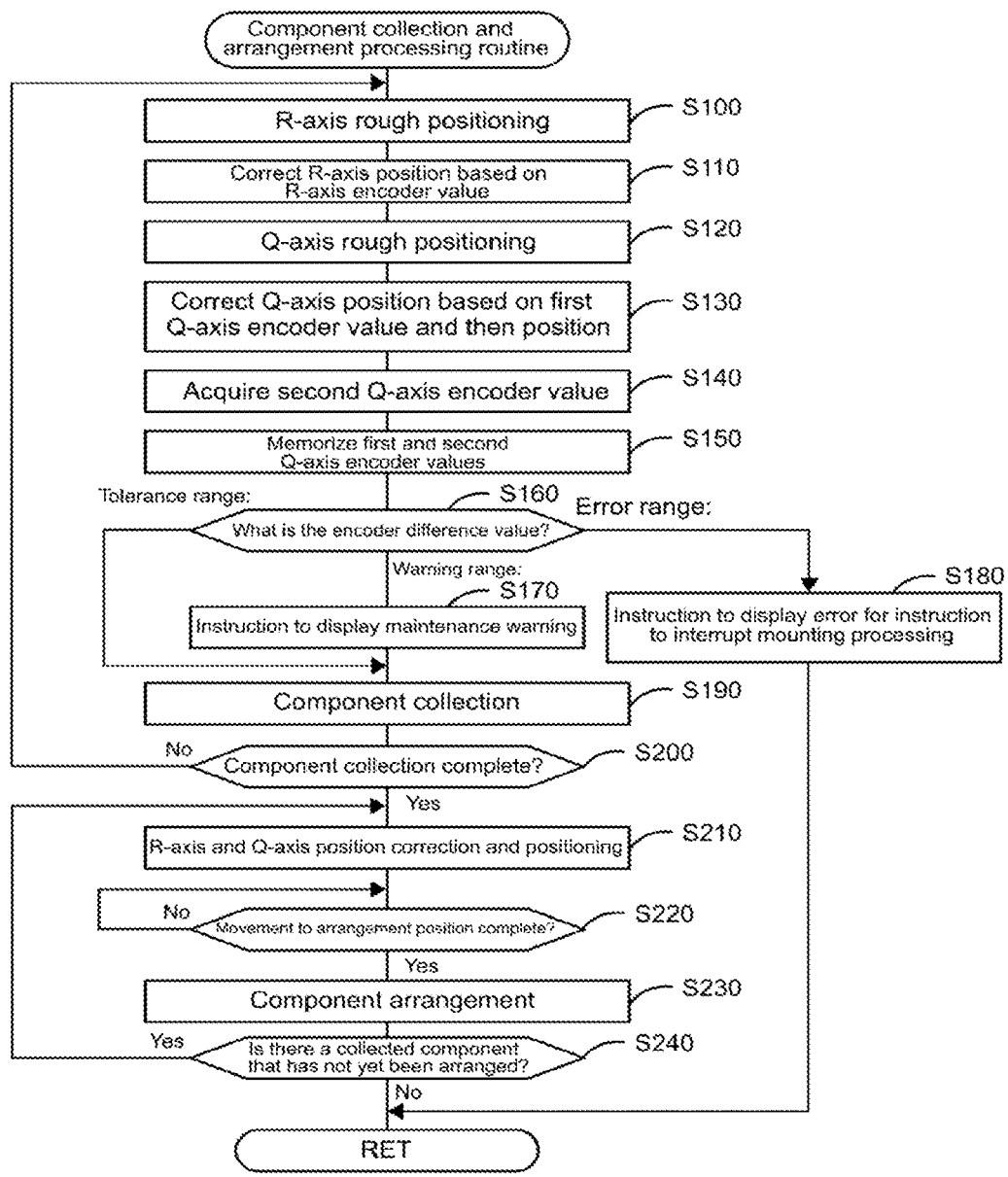
FIG. 5 is a flowchart showing an example of a component collection and arrangement routine.

Described next is the processing in the mounting processing routine for collecting component P using suction nozzle 42 and arranging the component P on board S. FIG. 5 is a flowchart showing an example of a component collection and arrangement processing routine run by the CPU of control section 41 provided in mounting head unit 17. This routine is memorized in memory section 41a of control section 41 and is performed at specified times. With this routine, processing is performed to correct the rotational position of component P, and detect the level of deformation such as twistedness in syringe member 56. When this routine is started, the CPU of control section 41 performs rough positioning of the R-axis (step S100), which is the rotational axis of rotary section 51 by driving R-axis motor 60 such that the component holding section 55 that is the target for raising and lowering operation is positioned at the specified raising and lowering position. This rough positioning uses a value of encoder 61 provided on R-axis motor 60 to drive control R-axis motor 60 such that rotary section 51 is positioned at a specified rotation position. Next, the CPU acquires a value of R-axis encoder 70, and based on this value drive controls R-axis motor 60 so at to correct the rotational position of the R-axis and position rotary section 51 at the correct rotational position (step S110).

Next, the CPU of control section 41 performs rough positioning of the Q axis (step S120), which is the rotational axis of component holding section 55 (suction nozzle 42). This rough positioning uses a value of encoder 64 provided on Q-axis motor 63 to drive control Q-axis motor 63 such that suction nozzle 42 is positioned at a specified rotation position. Next, the CPU acquires a value of first Q-axis encoder 73, and based on this value drive controls Q-axis motor 63 so at to correct the rotational position of the Q-axis and position syringe member 56 at the correct rotational position (step S130). Here, control device 41 may acquire a value of first Q-axis encoder 73 with suction nozzle 42 lowered to the extended position. In this way, control section 41 acquires the rotational position of suction nozzle 42 in a state in which component P is arranged.

Next, the CPU of control section 41 acquires a value of second Q-axis encoder 76 (step S140), and memorizes values of first Q-axis encoder 73 and second Q-axis encoder 76 in the memory section 41a linked to the component holding section 55 currently being used (step S150). In this way, the CPU saves a history of the states of component holding section 55. Continuing, the CPU calculates the difference between the values of first Q-axis encoder 73 and second Q-axis encoder 76, and judges whether this difference is within a range such as a tolerance range, a warning range, or an error range (step S160). The tolerance range, for example, is a range determined based on experience that covers a level of deformation such as twistedness of component holding section 55 which does not have a large influence on mounting processing. The warning range, for example, is a range determined based on experience wherein the level of deformation such as twistedness of component holding section 55 requires a relatively large amount of caution. The error range, for example, is a range determined based on experience wherein the component holding section 55 should be exchanged.

When the difference between the values of first Q-axis encoder 73 and second Q-axis encoder 76 is within the tolerance range, the CPU of control section 41 goes ahead and performs processing from step S190. On the other hand, if the difference is within the warning range, the CPU outputs a command to control device 80 to display a warning that maintenance should be performed or the like on operation panel 19 (step S170). Upon receiving this, control device 80 displays a message indicating that maintenance of component holding section 55 is required on display section 24 of operation panel 19. On the other hand, if the difference is within the error range, the CPU outputs a command to stop mounting processing and a command to display an error message indicating such on operation panel 19 to control device 80 (step S180) and then ends the routine. Upon receiving this command, control device 80 stops mounting processing and displays a message indicating that component exchange of component holding section 55 is required on display section 24 of operation panel 19.

After step S170, or when the difference value in step S160 is within the tolerance range, the CPU of control section 41 performs pickup processing of component P (step S190). In this processing, the CPU, after arranging mounting head unit 17 at the component collection position of the specified supply unit 18, drives Z-axis motor 66 such that suction nozzle is lowered to the extended position, and picks up component P at the tip of suction nozzle 42 by applying negative pressure in suction nozzle 42. Continuing, the CPU determines whether collection of components P that should be collected by mounting head 50 is complete (whether all collections are complete) (step S200), and if collections are not complete, performs processing from step S100. On the other hand, if collections of components P are complete, the CPU drives R-axis motor 60 such that component holding section 55 holding a component P to be arranged on board S is moved to the raising and lowering position, and then drives Q-axis motor 63 such that the rotational position of component P is correct (step S210). At this time, the CPU may perform processing the same as the above steps S100 to S140, or may perform correction of the rotational position and positioning of the R axis and Q axis re-using the correction values used in steps S100 to S140.

Continuing, the CPU of control section 41 determines whether mounting head unit 17 has finished moving to the arrangement position at which the component P should be arranged on board S (step S220), and stands by if movement to the arrangement position is not complete. When mounting head unit 17 has finished moving to the arrangement position, the CPU lowers component holding section 55 and performs arrangement processing of component P (step S230). Then, the CPU determines whether there is a component P collected on mounting head 50 that has not yet been arranged (step S240), and if there is a component P collected on mounting head 50 that has not yet been arranged, repeats the processing from step S210. On the other hand, if there are no components P collected on mounting head 50 that have not yet been arranged, the CPU ends the routine. The CPU continues to perform such processing until arrangement of components P on all boards S is complete.

Correspondences between constituent elements of the present embodiment and constituent elements of the invention will be clarified here. First Q-axis encoder 73 and second Q-axis encoder 76 of the present embodiment correspond to a detection section, suction nozzle 42 corresponds to a collection member, flange 43 corresponds to a cylindrical tube section of the collection member, mounting head 50 corresponds to a work head, support member 47 corresponds to a support member, rotary section 51 corresponds to a cylindrical tube section of the work head, and R-axis encoder 70 corresponds to a position detection section. Note that, for the present embodiment, an example of the present invention of control method of a mounting device is clear from the description of operation of mounting device 11.

According to mounting head unit 17 of the present embodiment as described above, first Q-axis encoder 73 detects the rotational position of suction nozzle 42 at a position facing suction nozzle 42 that holds component P. In this way, because the rotational position of the portion holding component P is detected directly, it is possible to more accurately acquire information related to the rotational position of component P held by suction nozzle 42. Also, for example, compared to a case in which encoder 64 that is separated from suction nozzle 42 is used, it is possible to position suction nozzle 42 more accurately. Also, because correction of the orientation of component holding section 55 is performed using detection results of the orientation of the portion holding the component P, the orientation of the component P is corrected more accurately. Further, because first Q-axis encoder 73 is arranged at a position facing flange 43, it is possible to detect the rotational position of suction nozzle 42 that is the closest to held component P, and it is possible to acquire the rotational position of component P even more accurately. Further still, because second Q-axis encoder 76 is arranged at a position facing the cylindrical tube section of syringe member 56, detection of the rotational position of component holding section 55 is easier compared to detecting the rotational position of suction nozzle 42 that has a relatively small diameter. Also, with mounting head unit 17, because the orientation of component holding section 55 is detected at two locations, suction nozzle 42 and syringe member 56, it is possible to detect the state (for example, deformation) of syringe member 56, or deviation between syringe member 56 and suction nozzle 42.

And, with mounting head unit 17, control section 41 memorizes in memory section 41a information related to the state of the syringe section (for example, deformation such as twistedness) based on the rotational position of suction nozzle 42 and the rotational position of the cylindrical tube section of syringe member 56 acquired from first Q-axis encoder 73 and second Q-axis encoder 76. Thus, with mounting head unit 17, the state of syringe member 56 can also be managed. Further, mounting head unit 17 is provided with element section 75 formed so as to face flange 43 (code section 74) in either the initial position or extended position of suction nozzle 42 when component holding section 55 is raised or lowered. Thus, with mounting head unit 17, it is possible to detect the orientation of component P based on the raised and lowered position of component holding section 55 such as in a case when component holding section 55 is raised or lowered while holding component P. Further still, with mounting head unit 17, because element section 72 of R-axis encoder 70 that detects the rotational position of rotary section 51 is arranged at a position facing rotary section 51 (cylindrical tube section), it is possible to directly acquire the rotational position of mounting head 50, and rotary section 51 can be positioned more accurately compared to when using encoder 64 that is separated from rotary section 51. Also, because mounting head unit 17 is provided with first Q-axis encoder 73 provided facing the suction nozzle 42 side (one end side), and second Q-axis encoder 76 provided facing the other end side of syringe member 56, it is possible to detect deformation such as twistedness of syringe member 56 in more detail. And, with mounting head unit 17, because the detection sections of first Q-axis encoder 73 and second Q-axis encoder 76 and the like are provided facing component holding section 55 from the outer circumferential side of mounting head 50, it is relatively easy to attach the detection sections.

Meanwhile, it goes without saying that the invention is not limited to the above-mentioned embodiment and various embodiments may be applied within the technical scope of the invention.

For example, in the above embodiment, first Q-axis encoder 73 is provided at a position facing suction nozzle 42, and second Q-axis encoder 76 is provided at a position facing the cylindrical tube section of syringe member 56, but the configuration is not limited to this, and either of first Q-axis encoder 73 or second Q-axis encoder 76 may be omitted. Even in this case, because the rotational position of component holding section 55 can be detected directly, it is possible to more accurately acquire information related to the rotational position of component P held by suction nozzle 42. Note that, in a case in which there is one detection section, mounting head unit 17 may omit management of information related to the deformation of syringe member 56.

In the above embodiment, code section 74 of first Q-axis encoder 73 is formed on flange 43, but the configuration is not limited to this so long as the code section is formed on a cylindrical tube-shaped outer surface of suction nozzle 42, for example, the code section may be formed on pipe section 44. In this case too, similar effects as the above embodiment are achieved. Also, code section 77 of second Q-axis encoder 76 is formed on the upper end side of syringe member 56, but it may be formed on any portion of syringe member 56.

In the above embodiment, the rotational position is detected at the bottom end and top end of component holding section 55, and the deformation or the like of component holding section 55 is detected, but this processing may be omitted. Even in this case, it is possible to more accurately acquire information related to the rotational position of component P held by suction nozzle 42.

In the above embodiment, first Q-axis encoder 73 is provided with element section 75 capable of detecting the rotational position of suction nozzle 42 in either the initial position or the extended position, but the configuration is not limited to this, for example, element section 75 may be configured to be raised and lowered along with the raising and lowering of suction nozzle 42. In this case too, it is possible to more accurately acquire the rotational position of component P according to the raising and lowering position of suction nozzle 42.

The above embodiment is provided with R-axis encoder 70, but this may be omitted. Even in this case, although correction of the rotational position of rotary section 51 is omitted, it is possible to more accurately acquire information related to the rotational position of component P held by suction nozzle 42.

In the above embodiment, a rotary type mounting head 50 that is rotatably held in head holding body 40 is described, but a fixed type work head that is held in a non-rotatable manner in head holding body 40 may be used. Also, although not described in the embodiment above, mounting device 11 may be provided with a mounting head unit in which multiple types of mounting heads are exchangeable in head holding body 40.

In the above embodiment, each detecting section is described as a reflective type optical encoder, but the configuration is not limited to this so long as the orientation of component holding section 55 can be detected, for example, a transparent type optical encoder, or a magnetic type encoder may be used. Also, each detection section detects the rotational position of component holding section 55, but the configuration is not limited to this.

The above embodiment is described as mounting device 11 provided with mounting head unit 17, however the embodiment is not limited to this, the embodiment may be mounting head unit 17 itself. Also, the above embodiment is described as mounting device 11, but the embodiment is not limited to this, the embodiment may be a control method of mounting head unit 17.

INDUSTRIAL APPLICABILITY

The present invention may be applied to the industrial field of electronic component mounting.

REFERENCE SIGNS LIST

10: mounting system; 11: mounting device; 12: mounting processing unit; 14: board conveyance unit; 15: board support unit; 16: head moving unit; 17: mounting head unit; 18: supply unit; 19: operation panel; 21: support plate; 22: conveyor belt; 23: support pin; 24: display section; 25: operation section; 26: X-axis slider; 28: guide rail; 30: Y-axis slider; 32: guide rail; 40: head holding body; 41: control section; 41a: memory section; 42: suction nozzle; 43: flange; 44: tube section; 45: holding body main body; 46: engaging shaft; 47: support member; 48: horizontal section; 50: mounting head; 51: rotary section; 52: Q-axis gear; 53: R-axis gear; 55: component holding section; 56: syringe member; 57: small gear; 60: R-axis motor; 61: encoder; 63: Q-axis motor; 64: encoder; 65: small gear; 66: Z-axis motor; 67: Z-axis guide; 68: horizontal section; 70: R-axis encoder; 71: code section; 72: element section; 73: first Q-axis encoder; 74: code section; 75: element section; 76: second Q-axis encoder; 77: code section; 78: element section; 80: control device; 81: CPU; 82: ROM; 83: HDD; 84: RAM; 85:input/output interface; 90: management computer; P: component; S: board

The invention claimed is:

1. A work head unit comprising:
a component holding section configured to hold a component and be rotatable around a rotational axis, the component holding section including a syringe member and a collecting member configured to collect the component and to be attached to and removed from the syringe member; and
a rotary section holding the component holding section;
a detection section extending along and facing the syringe member and the collecting member and configured to detect the orientation of the component holding section, wherein
the detection section includes a first optical type or magnetic type encoder positioned below the rotary section and configured to detect a rotational position of the collecting member, and
the detection section includes a second optical type or magnetic type encoder positioned above the rotary section and configured to detect a rotational position of the syringe.

2. The work head unit according to claim 1, further comprising:
a control section that includes a memory section and that is electrically connected to the detection section,
wherein the control section memorizes in the memory section information related to a state of the syringe member based on the rotational position of the syringe member and the rotational position of a cylindrical tube section of the collecting member acquired by the detection section.

3. The work head unit according to claim 2, further comprising:
a head holding body configured to hold the rotary section, wherein
the component holding section that includes the collecting member configured to collect the component, and the syringe member configured are attached to the rotary section in a raisable and lowerable manner, and
the detection section is provided on the head holding body and is fixed to an end side of a support member that extends to a position facing the collecting member of the component holding section.

4. The work head unit according to claim 3, wherein
the detection section is fixed to the support member so as to face a cylindrical tube section of the collecting member in either of an initial position of the collecting member or an extended position of the collecting member when the component holding section is raised and lowered.

5. The work head unit according to claim 3, wherein
the rotary section is held by the head holding body so as to be rotatable around a rotation axis, and includes a cylindrical tube section having the same center axis as the rotation axis, and
the detection section includes a position detecting section configured to detect the rotational position of the cylindrical tube section.

6. The work head unit according to claim 1, wherein
the rotary section is held by a head holding body in a rotatable state.

7. The work head unit according to claim 1, wherein
the collecting member is at least one of a suction nozzle configured to collect a component based on pressure, or a mechanical chuck configured to collect a component by grabbing.

8. The work head unit according to claim 1, wherein
the detection section is provided facing the component holding section from an outer circumferential side of the work head unit.

9. A mounting device provided with a mounting processing unit configured to perform mounting processing of a component on a board, the mounting processing unit being provided with the work head unit according to claim 1.

10. A work head unit control method for a work head provided with a rotary section, a component holding section held by the rotary section and configured to hold a component and be rotatable around a rotational axis, the component holding section including a syringe member and a collecting member configured to collect the component and to be attached to and removed from the syringe member, and a detection section extending along and facing the syringe member and the collecting member and configured to detect the orientation of the component holding section, the work head unit control method comprising:
(a) detecting a rotational position of the collecting member with a first optical type or magnetic type encoder of the detection section positioned below the rotary section;
(b) detecting a rotational position of the syringe with a second optical type or magnetic type encoder of the detection section positioned below the rotary section;
(c) a step of correcting an orientation of the component holding section based on by comparing the rotational position of the collecting member and the rotational position of the syringe.

11. The work head unit control method for the work head unit according to claim 10, wherein
in the step (c), the rotation angle of the collecting member is corrected.

* * * * *